US008765571B2

(12) United States Patent
Kononchuk et al.

(10) Patent No.: US 8,765,571 B2
(45) Date of Patent: Jul. 1, 2014

(54) METHOD OF MANUFACTURING A BASE SUBSTRATE FOR A SEMI-CONDUCTOR ON INSULATOR TYPE SUBSTRATE

(75) Inventors: Oleg Kononchuk, Theys (FR); Frederic Allibert, Albany, NY (US)

(73) Assignee: Soitec, Bernin (FR)

( * ) Notice: Subject to any disclaimer, the term of this patent is extended or adjusted under 35 U.S.C. 154(b) by 74 days.

(21) Appl. No.: 13/426,190

(22) Filed: Mar. 21, 2012

(65) Prior Publication Data

US 2012/0244687 A1 Sep. 27, 2012

(30) Foreign Application Priority Data

Mar. 22, 2011 (FR) ...................................... 11 52353

(51) Int. Cl.
*H01L 21/76* (2006.01)
(52) U.S. Cl.
USPC .... 438/403; 438/476; 438/906; 257/E23.016; 257/E21.32; 257/E21.561
(58) Field of Classification Search
USPC .................. 438/403, 476, 906; 257/E23.016, 257/E21.32, E21.561
See application file for complete search history.

(56) References Cited

U.S. PATENT DOCUMENTS

| 6,277,712 | B1 | 8/2001 | Kang et al. ............... 438/471 |
| 6,607,988 | B2* | 8/2003 | Yunogami et al. ........... 438/720 |
| 2005/0112845 | A1 | 5/2005 | Ghyselen et al. ............ 438/455 |
| 2005/0227428 | A1* | 10/2005 | Mihai et al. ............... 438/222 |
| 2006/0199353 | A1* | 9/2006 | Kub et al. ................. 438/455 |
| 2007/0032040 | A1 | 2/2007 | Lederer ..................... 438/455 |
| 2007/0232022 | A1 | 10/2007 | Henley et al. .............. 438/455 |
| 2007/0269663 | A1 | 11/2007 | Ghyselen et al. ............ 428/446 |
| 2007/0286956 | A1 | 12/2007 | Samoilov .................. 427/255.23 |

FOREIGN PATENT DOCUMENTS

| EP | 1 041 621 A2 | 10/2000 |
| KR | 1020040093302 A | 11/2004 |
| WO | WO 2010/002515 A2 | 1/2010 |

OTHER PUBLICATIONS

D. Lederer et al., "Enhanced high resistivity SOI wafers for RF applications", IEEE Intl. SOI Conf., pp. 46-47 (2004).
D. Lederer et al., "New substrate passivation method dedicated to HR SOI wafer fabrication with increased substrate resistivity", IEEE Electron Device Letters, vol. 26, No. 11, pp. 805-807 (2005).
D. Lederer et al., "RF performance of a commercial SOI technology transferred onto a passivated HR silicon substrate", IEEE Transactions on Electron Devices, vol. 55, No. 7, pp. 1664-1671 (2008).
D. C. Kerr et al., "Identification of RF harmonic distortion on Si substrates and its reduction using a trap-rich layer", IEEE, pp. 151-154 (2008).
French Search Report, application No. FR 1152353, dated Sep. 19, 2011.
European Search Report, application No. EP 12160793, May 4, 2012.

* cited by examiner

*Primary Examiner* — Michelle Mandala
(74) *Attorney, Agent, or Firm* — TraskBritt

(57) ABSTRACT

A method and system are provided for manufacturing a base substrate that is used in manufacturing a semi-conductor on insulator type substrate. The base substrate may be manufactured by providing a silicon substrate having an electrical resistivity above 500 Ohm·cm; cleaning the silicon substrate so as to remove native oxide and dopants from a surface thereof; forming, on the silicon substrate, a layer of dielectric material; and forming, on the layer of dielectric material, a layer of poly-crystalline silicon. These actions are implemented successively in an enclosure.

17 Claims, 3 Drawing Sheets

METHOD OF MANUFACTURING A BASE SUBSTRATE FOR A SEMI-CONDUCTOR ON INSULATOR TYPE SUBSTRATE

FIELD OF THE INVENTION

The present invention relates to a method of manufacturing a base substrate for the manufacture of a semi-conductor on insulator (SOI) type substrate, in particular, for radiofrequency applications.

BACKGROUND OF THE INVENTION

There exists at the present time different types of substrates for the production of radiofrequency (RF) devices.

A first type of substrate encompasses substrates comprising a layer of silicon on insulator substrate, such as, for example, silicon-on-quartz (SOQ), silicon-on-sapphire (SOS), or silicon-on-glass (SOG) substrates.

These substrates procure excellent radiofrequency performances but have very poor characteristics regarding logic devices, on account of the poorer quality of silicon. They are moreover very costly.

A second type of substrate is a high resistivity (HR) bulk silicon substrate.

"High resistivity" is typically taken to mean an electrical resistivity above 500 Ohm·cm.

These substrates have poorer performances than the first, and logic devices do not benefit from the advantages of SOI-type structures, but they have the interest of being inexpensive.

A third type of substrate is a substrate known as HR-SOI (High Resistivity Silicon on Insulator), in other words, constituted of a layer of silicon on a high resistivity silicon substrate, a thick layer of oxide being buried at the interface. This layer of oxide is thus generally designated by the term BOX ("Buried OXide").

Such substrates are particularly advantageous for the operation of logic devices, but exhibit poorer radiofrequency performances than SOQ or SOS substrates.

Indeed, these substrates have the drawback of sometimes including a layer of low resistivity under the oxide layer.

"Low resistivity," is taken to mean in the present text a resistivity below 500 Ohm·cm.

The presence of this low resistivity layer may be due to contamination of the surface of the substrates (for example, by a condensation of boron and/or phosphorous) before bonding. These contaminants are then encapsulated at the bonding interface, and are capable of diffusing into the high resistivity substrate.

Another cause of the formation of the low resistivity layer arises when the starting substrate is a silicon substrate with a high density of interstitial oxygen atoms: it is then necessary to carry out a heat treatment to make the oxygen precipitate and obtain the requisite high resistivity. However, it happens that atoms of oxygen diffuse into the substrate before or during this treatment, which leads to the formation in the substrate of regions with a low level of precipitation—thus a low resistivity—particularly in the vicinity of the surface of the substrate.

These two causes are presently difficult to control.

A fourth type of substrate consists in an HR-SOI-type substrate in which the HR substrate is improved by the addition of traps.

Different techniques have been developed in this aim, but they have the drawback of being very sensitive to the heat treatments implemented to manufacture the SOI than the devices on the latter.

For instance, it is known to deposit a layer of poly-crystalline silicon between the layer of oxide (BOX) and the HR substrate.

The reader may refer in this respect to the following publications: D. Lederer, R. Lobet and J.-P. Raskin, "Enhanced high resistivity SOI wafers for RF applications," IEEE Intl. SOI Conf., pp. 46-47, 2004; D. Lederer and J.-P. Raskin, "New substrate passivation method dedicated to high resistivity SOI wafer fabrication with increased substrate resistivity," IEEE Electron Device Letters, vol. 26, no. 11, pp. 805-807, 2005; D. Lederer and J.-P. Raskin, "RF performance of a commercial SOI technology transferred onto a passivated HR silicon substrate," IEEE Transactions on Electron Devices, vol. 55, no. 7, pp. 1664-1671, 2008; and D. C. Kerr et al., "Identification of RF harmonic distortion on Si substrates and its reduction using a trap-rich layer," 978-1-4244-1856-5/08, IEEE 2008.

Poly-crystalline silicon recrystallizes at high temperature, however, and the dopants present at the interface between the layer of poly-crystalline silicon and the HR silicon substrate diffuse into the latter, which has the effect of reducing the resistivity thereof.

PCT application WO 2010/002515 proposes for its part an alternative to the use of an HR silicon base substrate in the aforementioned HR-SOI substrates, by replacing the bulk base substrate by a structure comprising a thick semi-conductor layer with high resistivity on a support of standard resistivity.

To avoid dopants or contaminants present in the support risking diffusing into this highly resistive semi-conductor layer and thereby reducing its resistivity, it is recommended to place, between the support and the semi-conductor layer, a diffusion barrier. Such a diffusion barrier may consist of one or more layers of silicon oxide and/or silicon nitride and have a thickness of at least 20 nm.

Furthermore, by virtue of its high thickness (of the order of 50 to 100 µm), this resistive layer is comparable to a substrate.

Substrates for radiofrequency devices are subject to the fact that at high frequency, the electric field penetrates into the substrate and affects any charge carriers that it encounters, with as consequences, on the one hand, a needless consumption of energy (this effect is known as "transmission loss," or "insertion loss"); on the other hand, an influence on other devices, the behavior of which will be modified through the substrate (effect designated as "crosstalk").

In addition, the rise and descent of the signal induces a variation in the capacitance of the substrate, which leads to the generation of waves at harmonic frequencies of the main frequency. These harmonic waves and their combinations may constitute parasite signals particularly bothersome for radiofrequency applications. The use of a poly-crystalline silicon layer blocks the potential under the BOX, thereby limiting the capacitance variations and thus reducing the power of the harmonic waves generated.

Finally, the optional presence of charges in the BOX, as well as the use of direct voltages by certain devices, may lead to the creation of an accumulation or inversion layer (thus very conductive) under the BOX. The poly-crystalline silicon layer, blocking the potential under the BOX, eliminates this negative effect.

Thus, the present invention seeks to overcome the deficiencies of the art.

SUMMARY OF THE INVENTION

A goal of the present invention is thus to procure HR-SOI-type substrates not having the drawbacks of the substrates of the prior art. Furthermore, the invention also seeks to define a method of manufacturing an HR-SOI-type substrate that minimizes the loss of resistivity of the poly-crystalline silicon layer.

According to the invention, a method is proposed for manufacturing a base substrate for the manufacture of a semiconductor on insulator type substrate. This method comprises:
 (a) providing a silicon substrate having an electrical resistivity above 500 Ohm·cm,
 (b) cleaning the surface of the substrate, so as to remove the native oxide and/or dopants present on the surface of the substrate,
 (c) forming, on the substrate, a layer of dielectric material,
 (d) forming, on the layer, a layer of poly-crystalline silicon.
 This method being characterized in that steps (b), (c) and (d) are implemented successively in a same enclosure.

The substrate obtained at the end of step (d), in other words, formed of the silicon substrate, the dielectric material layer and the poly-crystalline silicon layer, may constitute a base substrate for an HR-SOI-type substrate, in other words, the portion of the SOI substrate that supports the insulating layer (BOX) and the thin semi-conductor layer.

Advantageously, the cleaning of step (b) comprises a heat treatment in a reducing atmosphere.

According to a preferred embodiment of the invention, the dielectric material is silicon oxide.

Step (c) then comprises advantageously a heat treatment of the silicon substrate in an oxidizing atmosphere.

Preferably, the oxidizing atmosphere comprises an inert gas and oxygen, the oxygen content being comprised between 100 and 5000 ppm.

Then, step (d) comprises a deposition of poly-crystalline silicon at a temperature less than or equal to 900° C.

The invention also relates to a method for the manufacture of a semi-conductor on insulator type substrate method that comprises transferring onto a base substrate, as disclosed herein, a layer of insulating material and a useful layer of semiconductor material to form the semi-conductor on insulator type substrate.

Another embodiment of the invention is a method for avoiding contamination when providing a high frequency base substrate, which comprises providing an enclosure for preparation of the substrate therein, wherein the base substrate is prepared as disclosed herein.

Yet another embodiment of the invention is a system for manufacturing a base substrate for use during manufacture of a semi-conductor on insulator type-substrate, comprising an enclosure in which a silicon substrate having an electrical resistivity above 500 Ohm·cm is provided, wherein, successively in the enclosure, the silicon substrate is cleaned in the enclosure so as to remove native oxide and dopants from a surface thereof, a layer of dielectric material is subsequently formed on the silicon substrate; and a layer of poly-crystalline silicon is formed on the dielectric material.

In a particularly advantageous manner, the enclosure in which are carried out steps (b) to (d) is an epitaxy frame.

Alternatively, the enclosure comprises a first chamber for the implementation of step (b), a second chamber for the implementation of step (c) and a third chamber for the implementation of step (d), with the chambers being connected via airlocks isolated from the exterior.

BRIEF DESCRIPTION OF THE DRAWINGS

Other characteristics and advantages of the invention will become more clear from the detailed description that follows, with reference to the appended drawings, in which.

DETAILED DESCRIPTION OF THE INVENTION

The steps of the method are described with reference to FIGS. 1 through 3.

Figure 1:
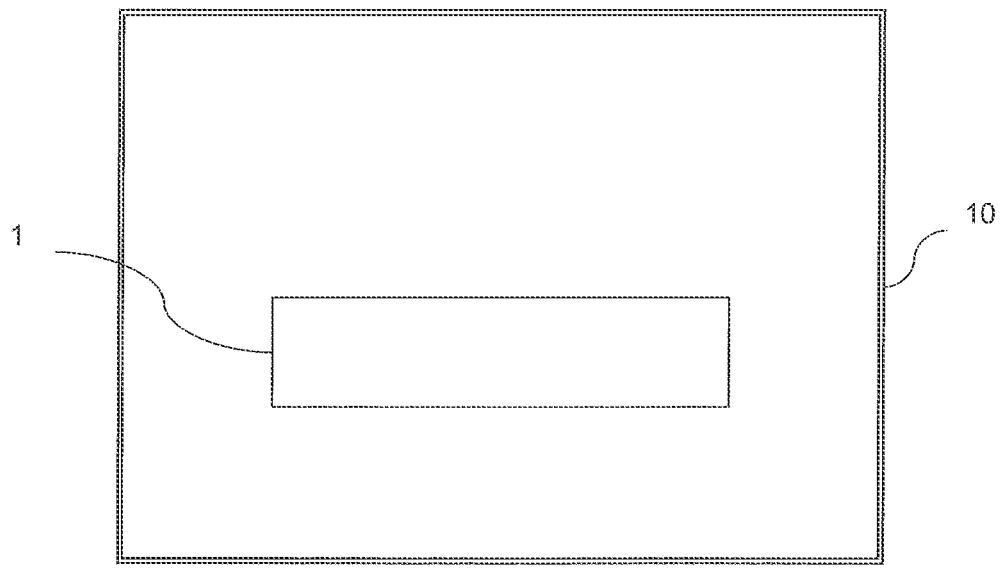
FIG. 1 is a diagram of the enclosure containing the high resistivity substrate.

As illustrated in FIG. 1, a substrate 1 that is made of high resistivity silicon is placed in an enclosure 10, which is isolated vis-à-vis the exterior environment.

In the present text, "high resistivity" is taken to mean an effective electrical resistivity above 500 Ohm·cm, preferably above 1000 Ohm·cm and in an even more preferred manner above 3000 Ohm·cm, the effective electrical resistivity being the resistivity of a uniform resistive component in an equivalent electric circuit.

A first step comprises cleaning of the substrate 1, so as to eliminate any native oxide and any contaminant present on the surface.

To this end, firstly a heat treatment of the substrate 1 in a reducing atmosphere is implemented so as to remove any native oxide from the surface.

For example, a treatment at 1100° C. under an $H_2$ atmosphere (known as "H2 bake") is applied for 30 seconds, but those skilled in the art will naturally be able to define other suitable conditions.

In a second step, a treatment of etching of the surface is implemented so as to remove a thin superficial layer of silicon contaminated by dopants.

For example, a heat treatment is applied at 1100° C. under an $HCl/H_2$ atmosphere for 30 seconds, so as to etch the surface of the substrate 1 over 0.1 and 0.5 micrometers.

A substrate is thus obtained, the surface of which is devoid of native oxide and contaminants.

Figure 2:
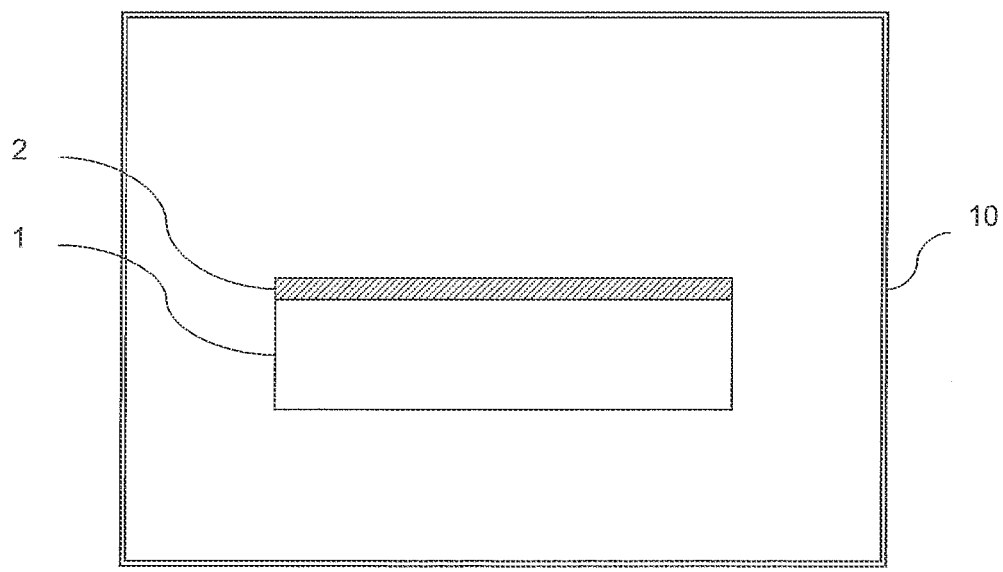
FIG. 2 illustrates in a schematic manner the formation, in the same enclosure, of a layer of dielectric material on the substrate.

Then, with reference to FIG. 2, while leaving the substrate 1 in the enclosure 10, a layer 2 of dielectric material is formed on the substrate 1.

Any dielectric material may be employed, as long as its formation does not lead to the introduction of contaminants.

According to a preferred embodiment of the invention, the dielectric material is silicon oxide.

In this case, the oxidation step may, for example, comprise a heat treatment at 1100° C. for 20 seconds in a slightly oxidizing atmosphere.

The composition of the slightly oxidizing atmosphere comprises mainly one or more inert gases (for example, argon), and a low proportion of oxygen, typically comprised between 100 and 5000 ppm.

It is indeed desirable not to introduce too much oxygen into the enclosure so as not to risk oxidizing the components of the frame or to contaminate the epitaxy frame.

It is estimated that a proportion of 1000 ppm of $O_2$ is sufficient to form a thin layer of oxide 2 on the surface of the substrate 1.

Figure 3:
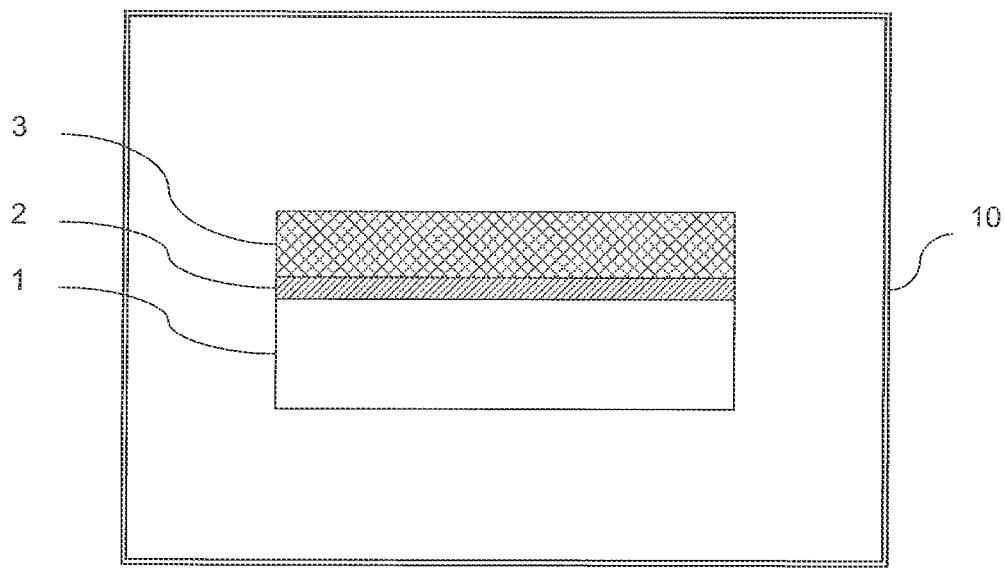
FIG. 3 illustrates in a schematic manner the deposition, in the same enclosure, of a layer of poly-crystalline silicon on the dielectric layer.

Finally, with reference to FIG. 3, and while still leaving the substrate 1 covered with the layer of oxide 2 in the enclosure 10, a layer of poly-crystalline silicon 3 is deposited on the layer of oxide 2.

The thickness of the layer 3 is of the order of 0.2 to 10 µm, preferably comprised between 0.3 and 3 µm.

The methods of depositing poly-crystalline silicon are well known to those skilled in the art.

An epitaxy technique at a sufficiently low temperature so that the silicon does not crystallize may particularly be employed. Typically, a temperature of the order of 900° C. is suitable.

Furthermore, the presence of an underlying layer of oxide (or, more generally, a dielectric material) leads to the formation of a poly-crystalline or amorphous layer.

The substrate 1, 2, 3 obtained at the end of this method may be used as a base substrate or receptor substrate for the manufacture of a semi-conductor on insulator type substrate, for example, by a method using technology provided under the trademark SMARTCUT®. Such a process is well known in the art and is described in various documents, including at soitec.com/pdf/Soitec_SmartCut_EN.pdf. Generally, a donor substrate is oxidized, implanted with ions such as hydrogen and helium to form a weakened zone therein, which defines a portion of the donor substrate and oxidized surface layer to be transferred to the base substrate. The donor and bas substrates are cleaned planarized and molecularly bonded before being split at the weakened zone to transfer the donor substrate portion to the base substrate. The transferred layer is typically annealed and polished to form the silicon on insulator wafer.

In particular, a step of deposition or growth of oxide or a dielectric material with low dielectric constant (known as "low-k"), heat treatment and planarization may be carried out with a view to preparing the surface of the base substrate thereby obtained for bonding with a donor substrate implanted beforehand to form an embrittlement zone delimiting the thin semi-conductor layer (for example, made of silicon) intended to become the useful layer.

Naturally, any other method of transferring a thin semi-conductor layer onto the base substrate may be implemented without, however, going beyond the scope of the present invention.

The semi-conductor on insulator substrate thereby obtained has particularly interesting properties for the formation of radiofrequency devices.

The fact of having carried out all the steps of cleaning, formation of the dielectric layer and deposition of poly-crystalline silicon in the same enclosure makes it possible to avoid any contamination of the substrate.

It ensues from this, that when the substrate is used as base substrate to manufacture a semi-conductor on insulator type substrate then to manufacture radiofrequency devices in or on the substrate, no diffusion of contaminants takes place under the effect of the heat treatments applied.

The resistivity of the layer 3 of poly-crystalline silicon is thus not affected by contaminants.

Enclosure is taken to mean in the present text any enclosed volume isolated from the exterior and equipped with suitable means to implement the cleaning, the formation of the oxide layer and the formation of the poly-crystalline silicon layer.

The enclosure may thus be a chamber, a reactor, an oven, etc., comprising:

- means for accessing, for introducing the silicon substrate and extracting the substrate on which have been formed the layer of dielectric material and the layer of poly-crystalline silicon,
- means for closing, to shut off the access in a sealed manner *vis-à-vis* the exterior,
- means for supporting the substrate during the cleaning and the formation of dielectric material and poly-crystalline silicon layers,
- means for heating, to heat the atmosphere and/or the substrate to the desired temperature for each of the steps,
- means for introducing gases and/or reagents of suitable composition for the cleaning, the oxidation or the deposition of dielectric material and the deposition of the poly-crystalline silicon,
- means for extracting residual gases and/or reagents at the end of each step of the method.

Those skilled in the art know different examples of these means and will be able to equip in an appropriate manner an enclosure to implement the method of the invention.

In a particularly advantageous manner, the enclosure is an epitaxy frame.

Indeed, such a frame is equipped with the means indicated above and the method may thus be implemented therein without requiring substantial adjustments to the installation.

However, it could also be envisaged, for example, to employ an oven intended for the deposition of poly-crystalline silicon, providing it is equipped with the necessary means for the implementation of the steps of cleaning and formation of the dielectric layer.

The method could also be implemented in a frame comprising several chambers, each intended for a step of the method, as long as the different chambers are connected together so that the substrate is not exposed to the exterior environment in the frame throughout the entire method.

Figure 4:
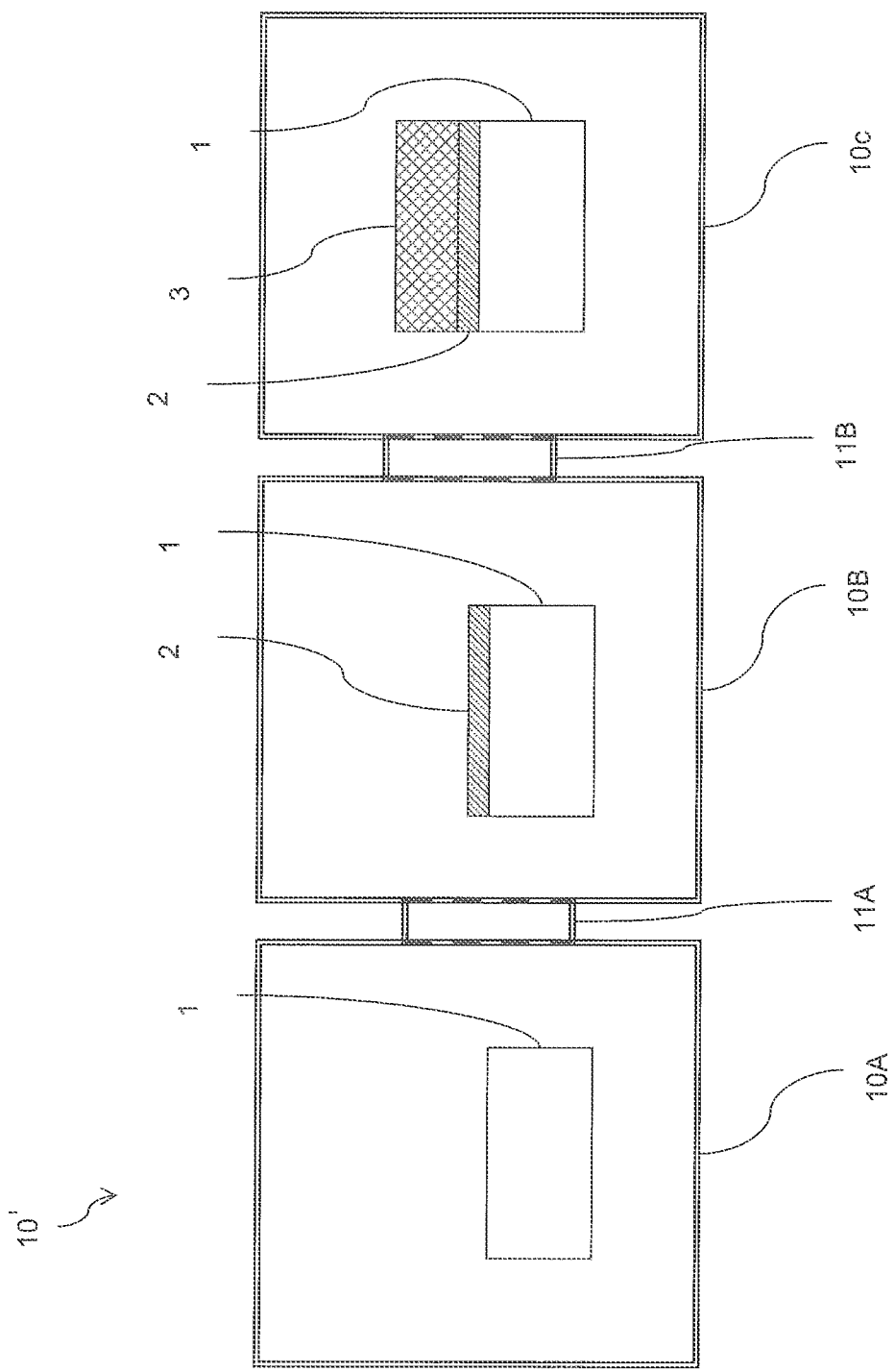
FIG. 4 illustrates a variant in which the method is implemented in an enclosure comprising several chambers.

An example of such a frame is illustrated in FIG. 4.

The frame 10' comprises three chambers 10A, 10B and 10C connected together via airlocks 11A, 11B, so as to form together an enclosure isolated from the exterior.

In the first chamber 10A is carried out the cleaning of the substrate 1.

This chamber 10A is essentially equipped with means of heating and introducing and extracting the gases constituting a suitable atmosphere for the cleaning.

The first chamber 10A is connected to a second chamber 10B via an airlock 11A isolated from the exterior.

The frame moreover comprises means (not shown) of conveying the substrate so as to transfer, at the end of the cleaning, the substrate 1 from the first chamber 10A (after extraction of the treatment atmosphere) to the second chamber 10B, through the airlock 11A.

The second chamber 10B essentially comprises for its part means for forming the dielectric layer 2, for example, of silicon oxide, on the substrate 1, particularly means for heating and introducing and extracting one or more inert gases.

The chamber 10B is connected to a third chamber 10C via an airlock 11B isolated from the exterior.

Means for conveying make it possible to transfer, at the end of the oxidation step, the substrate 1 covered with the dielectric layer 2 from the second chamber 10B (after extraction of the treatment atmosphere) to the third chamber 10C, through the airlock 11B.

The third chamber 10C comprises for its part means for growing a layer 3 of poly-crystalline silicon on the layer of oxide 2.

The chamber 10C may thus constitute an epitaxy frame.

Finally, it goes without saying that the examples that have been given are only particular illustrations that are in no way limiting with regard to the application fields of the invention.

What is claimed is:

1. A method of manufacturing a high resistivity base substrate, which comprises:
   (a) providing a silicon substrate having an electrical resistivity above 500 Ohm·cm,
   (b) cleaning the silicon substrate so as to remove native oxide and dopants from a surface thereof,
   providing, on the silicon substrate, a layer of dielectric material,
   (d) providing, on the layer of dielectric material, a layer of poly-crystalline silicon, and
   implementing steps (b), (c) and (d) successively in the same enclosure to minimize loss of resistivity of the poly-crystalline layer of the substrate.

2. The method according to claim 1, wherein the cleaning comprises a heat treatment in a reducing atmosphere.

3. The method according to claim 1, wherein the dielectric material comprises silicon oxide.

4. The method according to claim 3, wherein the providing of the layer of dielectric material comprises conducting a heat treatment of the silicon substrate in an oxidizing atmosphere to form the layer.

5. The method according to claim 4, wherein the oxidizing atmosphere comprises an inert gas having between 100 and 5000 ppm oxygen.

6. The method according to claim 1, wherein the layer of poly-crystalline silicon is deposited at a temperature of less than or equal to 900° C.

7. The method according to claim 1, wherein the enclosure comprises an epitaxy frame.

8. The method according to claim 1, wherein the enclosure comprises a first chamber for cleaning the silicon substrate, a second chamber for providing the layer of dielectric material and a third chamber for providing the layer of poly-crystalline silicon, the chambers being connected via airlocks isolated from an exterior.

9. A method for the manufacture of a semi-conductor on insulator type substrate method which comprises transferring onto the base substrate according to claim 1 a layer of insulating material and a useful layer of semiconductor material to form the semi-conductor on insulator type substrate.

10. A method for avoiding contamination when providing a high resistivity base substrate, which comprises providing an enclosure for preparation of the substrate therein, wherein the substrate is prepared by conducting successively the following steps in the enclosure:
   (a) providing a silicon substrate having an electrical resistivity above 500 Ohm·cm,
   (b) cleaning the silicon substrate so as to remove native oxide and dopants from a surface thereof,
   (c) providing, on the silicon substrate, a layer of dielectric material, and
   (d) providing, on the layer of dielectric material, a layer of poly-crystalline silicon to form the base substrate;
   wherein the substrate is prepared while minimizing loss of resistivity of the poly-crystalline layer of the substrate due to avoiding contamination.

11. The method according to claim 10, wherein the enclosure comprises a first chamber for cleaning the silicon substrate, a second chamber for providing the layer of dielectric material and a third chamber for providing the layer of poly-crystalline silicon, the chambers being connected via airlocks isolated from an exterior.

12. The method according to claim 1, which further comprises providing the enclosure with a first chamber for cleaning the silicon substrate, a second chamber for forming the layer of dielectric material and a third chamber for forming the layer of poly-crystalline silicon, and connecting the chambers via airlocks to isolate the enclosure from the surrounding atmosphere.

13. The method according to claim 12, which further comprises one or more of:
   accessing the enclosure for introducing or extracting substrates therefrom,
   closing the enclosure to shut off the access means in a sealed manner,
   supporting the substrate during cleaning or formation of layers thereon, or
   heating the enclosure.

14. The method according to claim 12, which further comprises:
   introducing gases or reagents of suitable composition for conducting the various steps for manufacturing the base substrate, and
   extracting residual gases or reagents after each step is conducted.

15. A method for minimizing loss of resistivity of a poly-crystalline layer of a high resistivity base substrate, which comprises preparing the base substrate according to the method of claim 1.

16. A method of manufacturing a high resistivity base substrate, which comprises:
   (a) providing a silicon substrate having an electrical resistivity above 500 Ohm·cm,
   (b) cleaning the silicon substrate in a reducing atmosphere so as to remove native oxide and dopants from a surface thereof,
   (c) providing, on the silicon substrate, a layer of dielectric material comprising silicon oxide, and
   (d) providing, on the layer of dielectric material, a layer of poly-crystalline silicon by deposition at a temperature of less than or equal to 900° C.,
   (e) implementing steps (b), (c) and (d) successively in the same enclosure to minimize loss of resistivity of the poly-crystalline layer of the substrate,
   wherein the enclosure comprises a first chamber for cleaning the silicon substrate, a second chamber for forming the layer of dielectric material and a third chamber for forming the layer of poly-crystalline silicon, and the chambers are connected via airlocks to isolate the enclosure from the surrounding atmosphere.

17. The method according to claim 16, which further comprises one or more of:
   accessing the enclosure for introducing or extracting substrates therefrom,
   closing the enclosure to shut off the access means in a sealed manner,
   supporting the substrate during cleaning or formation of layers thereon, or
   heating the enclosure.

* * * * *

UNITED STATES PATENT AND TRADEMARK OFFICE
CERTIFICATE OF CORRECTION

PATENT NO.         : 8,765,571 B2
APPLICATION NO.    : 13/426190
DATED              : July 1, 2014
INVENTOR(S)        : Oleg Kononchuk and Frederic Allibert It is certified that error appears in the above-identified patent and that said Letters Patent is hereby corrected as shown below:

In the claims:
CLAIM 1,   COLUMN 7,   LINE 11,   change "providing," to --(c) providing,--

Signed and Sealed this
Twenty-second Day of September, 2015

Michelle K. Lee
*Director of the United States Patent and Trademark Office*